United States Patent
Paschke

[15] 3,693,056

[45] Sept. 19, 1972

[54] METHOD FOR AMPLIFICATION OF HIGH-FREQUENCY ELECTRICAL SIGNALS IN A TRANSISTOR

[72] Inventor: Fritz Paschke, Vienna, Austria

[73] Assignee: Siemens Aktiengellschaft, Berlin, Germany

[22] Filed: Jan. 29, 1971

[21] Appl. No.: 110,924

[52] U.S. Cl..........317/235 R, 317/235 Z, 317/234 C, 307/307, 317/235 H

[51] Int. Cl...............................................H01l 11/06

[58] Field of Search.....317/234, 23, 40.13, 234, 1.51

[56] References Cited

UNITED STATES PATENTS

| | | | |
|---|---|---|---|
| 2,695,930 | 11/1954 | Wallace | 317/235 |
| 3,009,085 | 11/1961 | Petritz | 317/235 |

*Primary Examiner*—Jerry D. Craig
*Attorney*—Curt M. Avery, Arthur E. Wilfond, Herbert L. Lerner and Daniel J. Tick

[57] ABSTRACT

A method for the amplification of high-frequency electrical signals in a transistor having a base region, an emitter region and a collector region with the collector and emitter regions secured to the opposite surfaces of the base region, comprises applying an electrical field to the base region in a direction normal to a mid-line formed between the emitter and collector, the base region including charge carriers and charge carrier pairs; producing an impact ionization condition in the base region under the condition that the lifetime of the charge carrier in the base is greater than the ionization time; and applying a magnetic field to tee base region in a direction normal to the applied electric field and normal to the mid-line between the emitter and collector, said magnetic field urging the charge carrier pairs of the base region toward the collector.

14 Claims, 4 Drawing Figures

METHOD FOR AMPLIFICATION OF HIGH-FREQUENCY ELECTRICAL SIGNALS IN A TRANSISTOR

My invention relates to a method and apparatus for amplifying high-frequency electrical signals in a semiconductor device such as a transistor.

Transistors, commonly, are used for the amplification of high-frequency electrical signals. With a PNP-type transistor, the amplification results, in part, from the injection of majority charge carriers, namely holes, into the n-doped base region through the emitter-base junction from the emitter which is, for example, p-doped. Such holes are minority charge carriers in the base region and in combination with the majority charge carriers, electrons, there available, form pairs which diffuse to the collector. On application of an external alternating voltage to the emitter-base junction such diffusion takes place in waves. The finite lifetime of the pairs, however, attenuates the wave with the attenuation increasing in proportion to the frequency of the applied voltage. The transistor therefore has a cutoff frequency, above which amplification cannot be realized. It is, of course, possible to raise the cutoff frequency by using an extremely small base thickness. Such increase of the cutoff frequency is, however, limited by a practical minimum thickness of the base.

Further, the attenuation of the diffusion wave causes the current gain based upon the ratio of collector current to emitter current, under the condition of a very slight attenuation, to be, at the most, in the order of magnitude of unity.

An object of my invention is to provide a method for high amplification of high-frequency electrical signals in a semiconductor while avoiding the above-mentioned thin-base disadvantages.

Other objects, advantages and features of this invention will become more apparent from the following description.

These objects are achieved by impressing an electric field to the transistor base region at right angles to a mid-line between emitter and collector such that with the properties of the selected semiconductor material, the electric field is large enough to cause impact ionization in the base region under the condition that the lifetime of the charge carriers in the base region is greater than the ionization time and that a magnetic field is applied to the base region at right angles to the applied electrical field and normal to the mid-line between emitter and collector. The magnetic field drives the charge carrier pairs present in the base region between the emitter and collector toward the collector.

The electric field applied to the base gives rise to a direct current I in line with the applied electric field while the magnetic field supplies an auxiliary electric field, known as a Hall field, in the ± (IxB) direction (the positive sign applying to an n-doped base, and the negative to a p-doped base). The direction of the magnetic field is oriented so that the Hall field forces the minority charge carriers, and consequently the pairs, to the collector. With the condition that the ionization time is shorter than the lifetime of the charge carriers, the diffusion wave will increase exponentially in the direction from emitter to collector, while being markedly attenuated in the opposite direction. This wave increasing in accordance with the exponential law spatially is called convectively unstable.

For example, such a convectively unstable diffusion wave is excited with an n-doped base by injection of holes from the emitter; it increases exponentially in the base region and is then wholly reflected on the base-collector junction because of the significant potential gradient there. The reflected wave is not convectively unstable but markedly attenuated. It reaches the emitter region with an extremely low amplitude. Because of this, however, the current reaching the collector is a multiple of the emitter current, due to the law of charge preservation. This, however, makes the current amplification of a higher magnitude than unity, and higher as the base thickness increases.

As a further feature of the invention the transistor is cooled, thus making it possible to employ the transistor with extremely high frequencies in the range of some $10^{10}$ Hz.

The invention will be further described with reference to embodiments thereof, illustrated by way of example in the accompanying drawings, in which.

Figure 1:
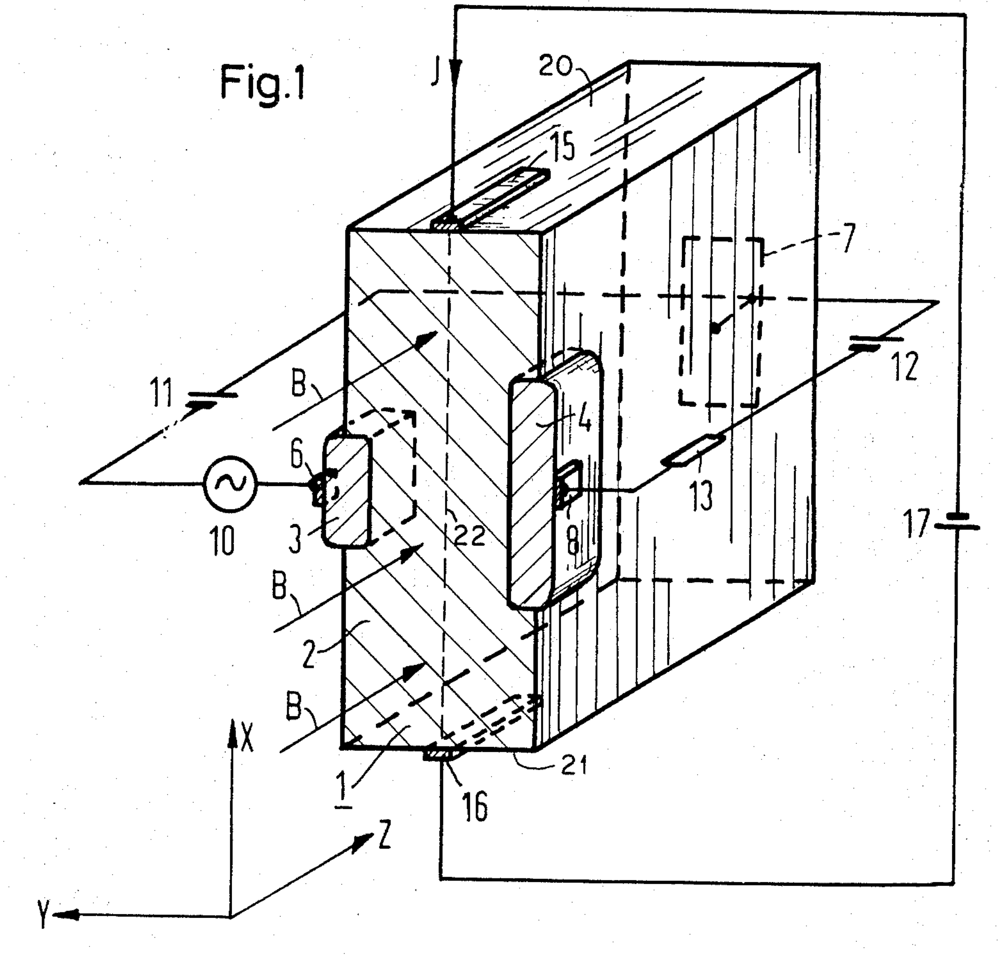
FIG. 1 is a perspective view of the emitter, base, and collector regions of the transistor of the invention.

Referring to the illustrations, particularly to FIG. 1, a transistor 1 comprises a base region 2, an emitter region 3, and a collector region 4. For purposes of illustration, base 2 is n-doped, while emitter 3 and collector 4 are p-doped. An emitted contact 6 is provided on emitter 3, a base contact 7 on base 2, and a collector contact 8 on collector 4.

Emitter contact 6 is connected to base contact 7 through an alternating current supply 10 and a direct current biasing supply 11. Base contact 7 is connected to collector contact 8 through a direct current biasing supply 12 and a load resistor 13.

Two contacts 15, 16 are provided along the top and bottom surfaces 20 and 21, respectively of base 2 and at right angles to a mid-main line 22 between the emitter 3 and collector 4. Contacts 15 and 16 are connected together to an external circuit through a direct current source 17.

Figure 2:
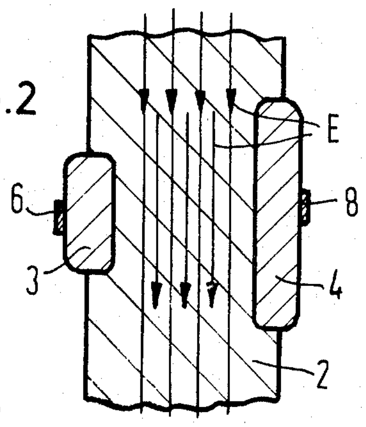
FIG. 2 is a view of the emitter, base and collector regions of a transistor with an applied electrical field between emitter and collector.

FIG. 2 is an enlarged view of the area between emitter 3 and collector 4 with a high electrical field intensity provided locally between the emitter-and-collector junctions. This can be obtained, for example, through an appropriate doping profile of the base in the X-direction (see FIG. 1).

The method according to the invention operates as follows:

The direct current supply 17 produces the flow of a current I. Direct current I brings transistor 1 to an electric field $E_x$ in the X-direction. Electric field $E_x$ is chosen large enough for impact ionization to appear in base region 2 between the emitter and collector.

Figure 3:
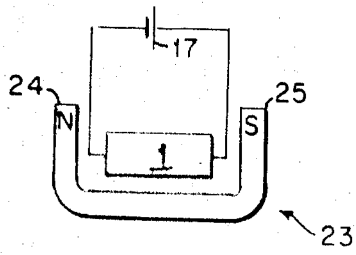
FIG. 3 is a view of a permanent magnet applying a magnetic field to the transistor.

With reference to FIGS. 1 and 3, a magnetic flux density B normal to the connecting line between emitter 3 and collector 4 and normal to the connecting line between contacts 15 and 16 is produced in base 2 by means of a permanent magnet 23 producing a magnetic field in the Z-direction. The magnet 23 is provided with North and South poles 24 and 25 in the conventional manner. Other methods for producing such a magnetic field may also be used, although for the strength of the magnetic field illustrated herein, a permanent magnet is satisfactory.

If the ionization time $\tau_i$ for the charge carriers in the base region is less than the lifetime $\tau_L$, the fields B and $E_x$ make the diffusion wave in base 2 convectively unstable in the (LxB) direction, such that the amplitude of the wave increases exponentially in the (−Y) direction. In the opposite (+Y) direction, though, the diffusion wave is significantly attenuated. This is of great importance for the stability of the amplifier.

Theoretic considerations have shown that convective instability occurs in heavily n-doped material for $$0<\omega^2<\frac{\left[\mu+\mu_p E_x B\left(1+\frac{\mu_p}{\mu}\right)\right]^2}{\frac{\mu_p k T_p}{e}\left[1+(\mu_p B)^2\right]}\left[\frac{1}{\tau i}-\frac{1}{\tau L}\right]$$

wherein $\omega$ stands for angular frequency, $\mu$ and $\mu_p$ the electron and hole mobilities, $T_p$ the temperature of the holes, $k$ the Boltzmann constant and $e$ is the elementary charge.

Similar corresponding conditions prevail for heavily p-doped and for intrinsic materials.

The injection of holes from emitter 3 into base 2 excites a convectively unstable diffusion wave in the latter. Such diffusion wave is amplified exponentially in the base region by the action of the fields B and $E_x$, and thus reaches the collector-base junction. There it is entirely reflected by reason of the high potential gradient. However, the reflected wave is not convectively unstable but is severely attentuated and reaches the emitter 3 with a very low amplitude. Because of this, the current flowing to collector 4 is a multiple of the emitter current, so that the current amplification is greater than unity. As the diffusion wave from the emitter 3 to collector 4 increases exponentially, the amplification increases in proportion to the width of the base region.

The electric field $E_x$ must not be short-circuited in base 2 by emitter 3 or collector 4. Since the collector-base junction is biased in the reverse or high-resistance direction, collector 4 is insulated from base 2 and cannot therefore affect field $E_x$. The emitter-base junction is, however, biased as a rule in the forward direction. To prevent a short-circuiting, it is therefore preferable for the electrical resistance of emitter 3 to be higher than the electrical resistance of base 2. Due to the considerable amplification within base 2, it is also possible, however, to slightly reverse bias the emitter-base junction and thereby insulate emitter 3 from base 2. In such case, the carrier injection from the emitter 3 into base region 2 is minimal, so that the amplification arises not through the transconductance of the emitter-base junction but through the increasing wave. The wave increase results from the effect of fields B and $E_x$, the excitation of the increasing wave from the current injection from emitter 3. The direct-current supply 17 delivers only enough power for the charge carrier production in the base, while the direct-current supply 12 supplies the direct-current power required for the power amplification. The direct-current supply 11 is used for setting the biasing level for weak biasing current.

From the above equation, it follows that the product $\mu$B of the election mobility $\mu$ and the magnetic flux B has to be as large as possible, in order to achieve a high cutoff frequency. From practical considerations, B must, of course, be small. For this reason a material exhibiting high electron mobility is desirable. Numerical values can be inferred from the condition that $\mu$B is at least in the order of magnitude of 0.1. N-doped indium antimonide may be used having a doping of $10^{14}$ donors/cm$^3$ and temperature of 77°K (liquid nitrogen) and an electron mobility of 600,000 cm$^2$/V sec at low electric field strengths and an electron mobility of around 300,000 cm$^2$/V sec at the high electric field used in this invention. The condition $\mu B = 0.1$ is achieved with B = 33.3 gauss.

For $E_x = 100$ V/cm with a magnetic field B of a few kilogauss, the cutoff frequency of the transistor according to the invention is equal to $10^6$ Hertz.

Silicon can also be employed as the semiconductor material. For n-doped silicon at room temperature and a doping of $10^{15}$ donors/cm$^3$, the electron mobility is 1,400 cm$^2$/V sec. The magnetic field intensity of 7.15 kilogauss required for the condition $\mu B = 0.1$ is easily achievable.

N-doped indium arsenide also may be utilized as the semiconductor material.

The field intensity of a few kilogauss for obtaining the high cutoff frequency is only illustrative. In the above indium-antimonide example, the magnetic field intensity is equal to 1 to 4 kilogauss.

To obtain still higher frequencies with indium antimonide, the temperature has to be lowered and/or the field intensity $E_x$ raised. Then for n-conductive indium antimonide as the semi-conductor material, the upper cutoff frequency at 4°K and at field intensity $E_x = 300$ V/cm is $50 \times 10^9$ Hertz.

Figure 4:
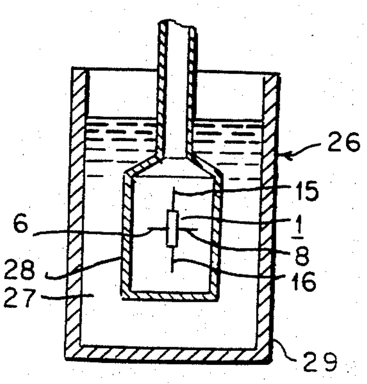
FIG. 4 is a view illustrating a transistor being cooled.

FIG. 4 is a view of apparatus for producing a low ambient temperature for the transistor. The semiconductor material 1 rests in a cooling bath 26 of, for example, liquid nitrogen or liquid helium 27. The transistor 1 is held in a partly copper plated epoxide resin frame 28 which is immersed in the coolant bath held in a conventional Dewar container 29.

In accordance with known principles, the cooling enables higher frequency signals to be accommodated in a transistor. The explanation is as follows. The increase of the wave transmitted to the collector produces a very high density of pairs in front of the collector. The development of such a high pair density is counteracted by the diffusion, that is, the pressure gradient of the pairs. This counteraction is decreased in proportion to the temperature of the minority charge carriers. By utilizing the cooling bath of FIG. 4, the temperature of the minority charge carriers is significantly decreased.

It will thus be seen that the objects set forth above, among those made apparent from the preceding description, are efficiently attained and, since certain changes may be made in the above method without departing from the scope of the invention, it is intended that all matter contained in the above description and shown in the accompanying drawings shall be interpreted as illustrative and not in a limiting sense.

I claim:

1. A method for the amplification of high-frequency electrical signals in a transistor having a base region, an emitter region and a collector region secured to opposite surfaces of said base region, a mid-line being formed between said emitter and collector, the emitter region accepting an input signal and the collector region providing an output signal, said method comprising the steps of applying an electric field to said base region in a direction normal to said mid-line, said base region including charge carriers and charge carrier pairs, producing an impact ionization condition in the base region under the condition that the lifetime of the charge carriers in the base is greater than the ionization time and applying a magnetic field to the base region in a direction normal to the applied electrical field and normal to said mid-line, said magnetic field urging the charge carrier pairs in the base region toward the collector.

2. A method as claimed in claim 1, further comprising the step of cooling the transistor.

3. A method as claimed in claim 1, further comprising the step of forming the transistor of a semiconductor material having a high electron mobility.

4. A method as claimed in claim 3, wherein the semiconductor material is indium antimonide.

5. A method as claimed in claim 3, wherein the semiconductor material is n-doped indium arsenide.

6. A method as claimed in claim 1, wherein the method is undertaken under the condition that the electric resistance of the emitter is greater than the electric resistance of the base.

7. A method as claimed in claim 1, further comprising the step of reverse biasing said emitter-base junction.

8. A method as claimed in claim 1, further comprising the step of forming a high electric field gradient by a doping profile in the base region in a predetermined direction.

9. A method as claimed in claim 1, further comprising the step of applying the magnetic field with a permanent magnet.

10. Apparatus for the amplification of high-frequency electrical signals in a transistor having a base region, an emitter region and a collector region secured to opposite surfaces of said base region, a mid-line formed between said emitter and collector, the emitter region accepting an input signal and the collector region providing an output signal, comprising means for applying an electric field to said base region in a direction normal to said mid-line, said base region including charge carriers and charge carrier pairs, means for producing an impact ionization condition in the base region under the condition that the lifetime of the charge carriers in the base is greater than the ionization time and means for applying a magnetic field to the base region in a direction normal to the applied electrical field and normal to the mid-line between the emitter and collector, said magnetic field urging the charge carrier pairs in the base region toward the collector.

11. Apparatus as claimed in claim 10, further comprising means for cooling the transistor.

12. Apparatus as claimed in claim 10, wherein the transistor is formed of a semiconductor material having a high electron mobility.

13. Apparatus as claimed in claim 10, wherein the electric resistance of the emitter is greater than the electric resistance of the base.

14. Apparatus as claimed in claim 10, wherein said means for applying a magnetic field comprises a permanent magnet having North and South poles with said transistor between said North and South poles.

* * * * *